(12) United States Patent
Chowdhury et al.

(10) Patent No.: US 9,389,029 B2
(45) Date of Patent: Jul. 12, 2016

(54) HEAT TRANSFER STRUCTURE

(71) Applicant: Apple Inc., Cupertino, CA (US)

(72) Inventors: Ihtesham H. Chowdhury, Sunnyvale, CA (US); Henry H. Lam, San Jose, CA (US); Derek W. Wright, San Francisco, CA (US); Amaury J. Heresztyn, Woodside, CA (US)

(73) Assignee: APPLE INC., Cupertino, CA (US)

( * ) Notice: Subject to any disclaimer, the term of this patent is extended or adjusted under 35 U.S.C. 154(b) by 145 days.

(21) Appl. No.: 14/077,550

(22) Filed: Nov. 12, 2013

(65) Prior Publication Data

US 2015/0092351 A1    Apr. 2, 2015

Related U.S. Application Data

(60) Provisional application No. 61/884,412, filed on Sep. 30, 2013.

(51) Int. Cl.
| | | |
|---|---|---|
| *H05K 7/20* | (2006.01) | |
| *F28F 21/06* | (2006.01) | |
| *H01L 23/373* | (2006.01) | |
| *H01L 23/433* | (2006.01) | |
| *G06F 1/20* | (2006.01) | |
| *F28F 21/02* | (2006.01) | |
| *F28F 13/00* | (2006.01) | |

(52) U.S. Cl.
CPC ............... *F28F 21/06* (2013.01); *G06F 1/203* (2013.01); *H01L 23/373* (2013.01); *H01L 23/433* (2013.01); *F28F 21/02* (2013.01); *F28F 2013/006* (2013.01); *F28F 2255/02* (2013.01); *H01L 2924/0002* (2013.01)

(58) Field of Classification Search
CPC .......... F28F 21/02; F28F 21/06; G06F 1/203; H01L 23/373; H01L 23/433; H05K 7/20454
USPC ............... 361/679.46–679.54, 688–723; 165/80.1–80.3, 104.11–104.34, 185
See application file for complete search history.

(56) References Cited

U.S. PATENT DOCUMENTS

| | | |
|---|---|---|
| 4,104,523 A | 8/1978 | Wolfert |
| 4,614,528 A | 9/1986 | Lennen |
| 4,620,248 A | 10/1986 | Gitzendanner |
| 4,863,499 A | 9/1989 | Osendorf |
| 4,967,201 A | 10/1990 | Rich, III |
| 4,975,761 A | 12/1990 | Chu et al. |
| 4,982,783 A | 1/1991 | Fickett et al. |
| 5,025,336 A | 6/1991 | Morehouse et al. |

(Continued)

FOREIGN PATENT DOCUMENTS

| | | |
|---|---|---|
| JP | 2000252667 | 9/2000 |
| JP | 2004022928 | 1/2004 |

*Primary Examiner* — Anthony Haughton
*Assistant Examiner* — Yahya Ahmad
(74) *Attorney, Agent, or Firm* — Brownstein Hyatt Farber Schreck, LLP (57) ABSTRACT

An electronic device can include a heat transfer structure that is positioned between a first component that generates heat and a second component that dissipates heat. The heat transfer structure transfers heat from the first component to the second component. The heat transfer structure can include a heat transfer member including a thermal conductive layer attached to at least one flexible layer and at least one deformable region created by a shape of the heat transfer member.

25 Claims, 10 Drawing Sheets

(56) References Cited

U.S. PATENT DOCUMENTS

| | | |
|---|---|---|
| 5,050,038 A | 9/1991 | Malaurie et al. |
| 5,148,337 A | 9/1992 | Cullen et al. |
| 5,392,177 A | 2/1995 | Chainer et al. |
| 5,440,172 A | 8/1995 | Sutrina |
| 5,500,785 A | 3/1996 | Funada |
| 5,586,007 A | 12/1996 | Funada |
| 5,781,768 A | 7/1998 | Jones, Jr. |
| 5,792,677 A | 8/1998 | Reddy et al. |
| 5,898,573 A | 4/1999 | Fugaro |
| 5,905,636 A | 5/1999 | Baska et al. |
| 6,076,171 A | 6/2000 | Kawata |
| 6,143,058 A | 11/2000 | Dahlgren et al. |
| 6,160,705 A | 12/2000 | Stearns et al. |
| 6,175,088 B1 | 1/2001 | Saccocio |
| 6,212,071 B1 | 4/2001 | Roessler et al. |
| 6,239,972 B1 | 5/2001 | Tehan et al. |
| 6,243,269 B1 | 6/2001 | Dibene et al. |
| 6,243,656 B1 | 6/2001 | Arai et al. |
| 6,286,212 B1 | 9/2001 | Eaton |
| 6,347,037 B2 | 2/2002 | Iijima et al. |
| 6,407,595 B1 | 6/2002 | Huang et al. |
| 6,462,410 B1 | 10/2002 | Novotny et al. |
| 6,504,243 B1 | 1/2003 | Andric et al. |
| 6,507,102 B2 | 1/2003 | Juskey et al. |
| 6,556,455 B2 | 4/2003 | Dibene et al. |
| 6,624,816 B1 | 9/2003 | Jones, Jr. |
| 6,687,320 B1 | 2/2004 | Chiu et al. |
| 6,747,300 B2 | 6/2004 | Nadd et al. |
| 6,778,387 B2 | 8/2004 | Fairchild |
| 6,803,328 B2 | 10/2004 | McCullough |
| 6,832,410 B2 | 12/2004 | Hedge |
| 6,847,529 B2 | 1/2005 | Dibene et al. |
| 6,886,625 B1 | 5/2005 | Sagal et al. |
| 6,891,724 B2 | 5/2005 | De Lorenzo et al. |
| 6,896,045 B2 | 5/2005 | Panek |
| 6,900,992 B2 | 5/2005 | Kelly et al. |
| 6,930,885 B2 | 8/2005 | Barcley |
| 6,956,549 B2 | 10/2005 | Naiki |
| 6,987,671 B2 | 1/2006 | Houle |
| 7,006,353 B2 | 2/2006 | Matteson |
| 7,045,719 B1 | 5/2006 | Cohen et al. |
| 7,045,885 B1 | 5/2006 | Chen et al. |
| 7,085,135 B2 | 8/2006 | Chu et al. |
| 7,125,433 B2 | 10/2006 | Garikipati et al. |
| 7,149,909 B2 | 12/2006 | Cui et al. |
| 7,190,585 B2 | 3/2007 | Houle |
| 7,215,551 B2 | 5/2007 | Wang et al. |
| 7,269,015 B2 | 9/2007 | Hornung et al. |
| 7,270,176 B2 | 9/2007 | Bell et al. |
| 7,295,441 B1 | 11/2007 | Laio et al. |
| 7,301,755 B2 | 11/2007 | Rodriguez et al. |
| 7,393,226 B2 | 7/2008 | Clayton et al. |
| 7,401,243 B2 | 7/2008 | Knepper et al. |
| 7,433,191 B2 | 10/2008 | Blanco, Jr. et al. |
| 7,440,281 B2 | 10/2008 | Bailey et al. |
| 7,451,332 B2 | 11/2008 | Culbert et al. |
| 7,454,316 B2 | 11/2008 | Bose et al. |
| 7,532,480 B1 | 5/2009 | Mimberg |
| 7,148,125 B2 | 8/2009 | Takayama et al. |
| 7,671,282 B2 | 3/2010 | Lee |
| 7,730,336 B2 | 6/2010 | Marinkovic et al. |
| 7,782,613 B2 | 8/2010 | Harris |
| 7,787,249 B2 | 8/2010 | Sundstrom |
| 7,787,252 B2 | 8/2010 | Mertol |
| 7,800,916 B2 | 9/2010 | Blackwell et al. |
| 7,805,689 B2 | 9/2010 | Ueda et al. |
| 7,840,827 B2 | 11/2010 | Dahan et al. |
| 7,866,941 B2 | 1/2011 | Li et al. |
| 7,880,586 B2 | 2/2011 | Fagrenius et al. |
| 7,882,369 B1 | 2/2011 | Kelleher et al. |
| 8,115,112 B2 | 2/2012 | Corisis et al. |
| 8,165,646 B2 | 4/2012 | Zheng |
| 8,215,012 B2 | 7/2012 | Blanco, Jr. et al. |
| 8,253,026 B2 | 8/2012 | Strauss et al. |
| 8,260,097 B2 | 9/2012 | Meadowcroft et al. |
| 8,345,414 B2 | 1/2013 | Mooring et al. |
| 8,383,962 B2 | 2/2013 | Sutardja |
| 8,477,490 B2 | 7/2013 | Rothkopf et al. |
| 8,482,929 B2 | 7/2013 | Slaton et al. |
| 8,525,840 B2 | 9/2013 | Hendry et al. |
| 8,735,728 B2 | 5/2014 | Cheng |
| 2005/0077614 A1 | 4/2005 | Chengalva et al. |
| 2006/0120051 A1 | 6/2006 | Macris et al. |
| 2006/0134831 A1 | 6/2006 | Cohen et al. |
| 2007/0102142 A1* | 5/2007 | Reis et al. .......... 165/80.3 |
| 2008/0049394 A1 | 2/2008 | Nishi |
| 2008/0211398 A1* | 9/2008 | DeCook et al. .......... 313/506 |
| 2008/0225484 A1* | 9/2008 | Brodsky et al. .......... 361/699 |
| 2010/0103147 A1 | 4/2010 | Sumpter |
| 2011/0085304 A1 | 4/2011 | Bindrup et al. |
| 2011/0194252 A1 | 8/2011 | Wang |
| 2011/0232881 A1* | 9/2011 | Downing et al. .......... 165/133 |
| 2012/0318484 A1* | 12/2012 | Hirasawa .......... 165/134.1 |
| 2014/0160684 A1 | 6/2014 | Wittenberg et al. |
| 2015/0002769 A1 | 1/2015 | Kalyanasundaram |

\* cited by examiner

HEAT TRANSFER STRUCTURE

CROSS-REFERENCE TO RELATED APPLICATION

This application claims the benefit of and priority to U.S. Provisional Patent Application No. 61/884,412, filed Sep. 30, 2013 and titled "Heat Transfer Structure," the disclosure of which is hereby incorporated herein in its entirety.

TECHNICAL FIELD

The present invention relates to electronic devices, and more particularly to a heat transfer structure that transfers heat from one component to another component in an electronic device.

BACKGROUND

Microprocessors, integrated circuits, displays, and other sophisticated electronic components in an electronic device should typically operate within a certain range of temperatures. Some of these components, however, can generate relatively high temperatures and heat during operation of the electronic device. For example, microprocessors, integrated circuits, and displays can produce excessive heat during operation. The excessive heat can degrade the performance of these components, which can in turn adversely impact the reliability and performance of the electronic device. And over time, in some devices the heat produced by these components can result in system failure.

Figure 1:
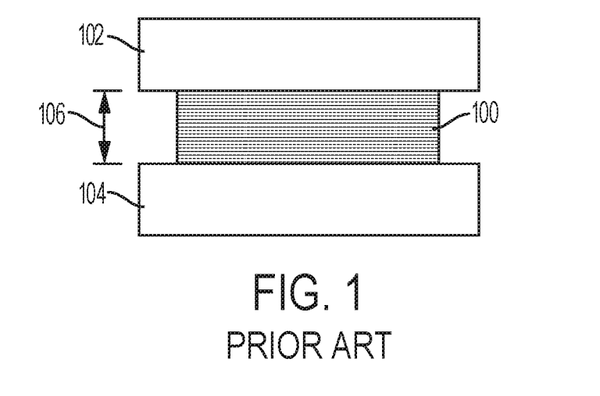
FIG. 1 illustrates a simplified side view of a prior art electronic device with a heat dissipating structure between two components.

One type of a heat dissipation structure is a heat sink. A heat sink is a component that facilitates heat dissipation from the surface of a heat source, such as a heat-generating electronic component, to a cooler environment, typically air. Another type of heat dissipation structure is a heat spreader that can dissipate heat by transferring the heat from a heat source to another substrate, as shown in FIG. 1. A heat spreader 100 is positioned between an electronic component 102 and a second component 104. The heat spreader 100 is made of a thermally conductive material that transfers some of the heat generated by the electronic component 102 to the second component 104.

In some devices, the gap 106 between the electronic component 102 and the second component 104 is not always known or certain when constructing the device. For example, the gap 106 can vary from device to device due to manufacturing variances, or different devices that include the same electronic component 102 can be designed with different sized gaps. Additionally, some components can be damaged or the performance of a component can be adversely affected when a heat dissipation structure introduces a physical pressure on the electronic component 102. For example, a heat dissipating structure positioned on the bottom surface of a display, such as a liquid crystal display, can produce pressure on the bottom surface of the display, and this pressure can result in the formation of artifacts that are visible in images viewed on the display.

SUMMARY

Embodiments described herein provide a heat transfer structure that may introduce reduced or near zero physical pressure on an electronic component. In one aspect, the heat transfer structure can include a heat transfer member that includes a thermal conductive layer attached to at least one flexible layer, and at least one deformable region created by a shape of the heat transfer member. The at least one deformable region allows the heat transfer structure to deform or flex, which can result in the heat transfer structure introducing reduced physical pressure on the electronic component.

In another aspect, an electronic device can include an electronic component that generates heat and a second component that dissipates heat. A heat transfer structure is disposed between the electronic and second components to transfer heat from the electronic component to the second component. The heat transfer structure may include a heat transfer member that includes a thermal conductive layer attached to at least one flexible layer, and at least one deformable region created by a shape of the heat transfer member.

In yet another aspect, a method for providing a heat transfer structure can include providing a heat transfer member that includes a thermal conductive layer attached to at least one flexible layer, and providing at least one deformable region that is created by a shape of the heat transfer member.

BRIEF DESCRIPTION OF THE DRAWINGS

Embodiments of the invention are better understood with reference to the following drawings. The elements of the drawings are not necessarily to scale relative to each other. Identical reference numerals have been used, where possible, to designate identical features that are common to the figures.

DETAILED DESCRIPTION

Embodiments described herein provide a heat transfer structure that may generate reduced or near zero physical pressure on an electronic component. The heat transfer structure can include a heat transfer member that includes a thermal conductive layer attached to at least one flexible layer, and at least one deformable region created by a shape of the heat transfer member. The at least one deformable region allows the heat transfer structure to deform or flex, which can result in the heat transfer structure introducing reduced or near zero physical pressure on the electronic component.

One or more heat transfer structures can be included in an electronic device. The heat transfer structure can be positioned between an electronic component that generates heat and a second component that dissipates heat. The heat transfer structure transfers heat from the electronic component to the second component. In one embodiment, the heat transfer structure is positioned between a display and a second component. The heat transfer member in the heat transfer structure can be disposed between a flexible layer and an adhesive layer. Alternatively, the heat transfer member can be positioned between two flexible layers. An adhesive layer can be disposed over at least one of the adhesive layers. The heat transfer member can be configured into various shapes that produce or result in at least one deformable region adjacent to the heat transfer member. For example, in one embodiment the heat transfer member is wrapped onto itself in a rounded shape, and the interior region of the rounded shape forms the deformable region. As another example, the heat transfer member has a wing-like shape or a "U" shaped region with extended horizontal surfaces at the tops of the sides of the U-shaped region, and the regions within and between the U-shaped region create the deformable regions.

In some embodiments, the heat transfer member can include one or more openings or cutouts that prevent heat from transferring to a substrate at the locations of the cutouts or openings. Additionally or alternatively, the thermal conductive layer in the heat transfer member can include one or more regions that have higher thermal density than other regions of the thermal conductive layer. The regions having a higher thermal density or densities can transfer different amounts of heat to a substrate than other regions of the thermal conductive layer. In some embodiments, the thermal conductive layer is formed with a metal such as copper, silver, or gold. The metallic thermal conductive layer can function as an EMI or RF shield for one or more electronic components disposed below the metallic thermal conductive layer.

Directional terminology, such as "top", "bottom", "front", "back", "leading", "trailing", etc., is used with reference to the orientation of the Figure(s) being described. Because components of embodiments described herein can be positioned in a number of different orientations, the directional terminology is used for purposes of illustration only and is in no way limiting. When used in conjunction with layers of a device, the directional terminology is intended to be construed broadly, and therefore should not be interpreted to preclude the presence of one or more intervening layers or other intervening features or elements. Thus, a given layer that is described as being formed, positioned, disposed on or over another layer, or that is described as being formed, positioned, disposed below or under another layer may be separated from the latter layer by one or more additional layers or elements.

Figure 2:
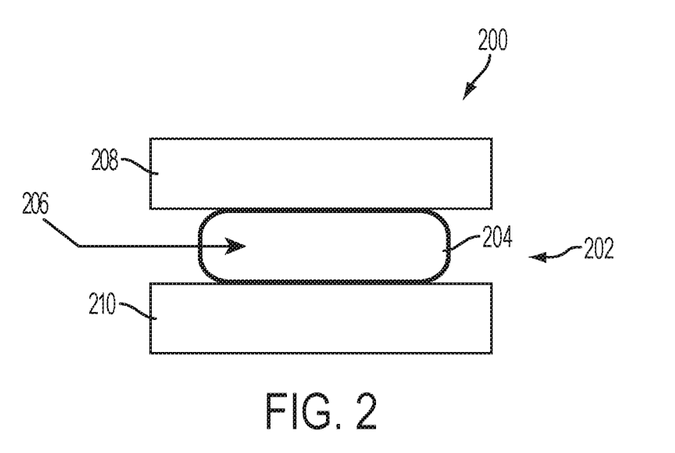
FIG. 2 depicts a simplified side view of an electronic device with a heat transfer structure between two components in one embodiment.

Referring now to FIG. 2, there is shown a simplified side view of an electronic device with a heat transfer structure between two components in one embodiment. The heat transfer structure 202 in the electronic device 200 includes a heat transfer member 204 and a deformable region 206. In some embodiments, the deformable region 206 can be created by the shape of the heat transfer member 204. In the illustrated embodiment, the heat transfer member has a rounded shape, and the interior region of the rounded shape forms the deformable region 206.

The heat transfer structure 202 is positioned between a first component 208 and a second component 210. The heat transfer structure 202 can be attached to the first and second components using any suitable attachment mechanism. For example, an adhesive can be used to affix the heat transfer structure 202 to the first and second components 208, 210. As will be described in more detail later, the heat transfer member 204 includes a thermal conductive layer that is used to transfer heat from one component that is a heat source (e.g., first component 208) to another component that dissipates the transferred heat (e.g., second component 210).

In one embodiment, the first component 208 is an electronic component and the second component 210 is a support structure for the electronic component 208. By way of example only, the electronic component can be a display in an electronic device such as a smart telephone, a tablet computing device, a wearable computing device or display, and a digital music player. The display can include any suitable display technology, including, but not limited to a multi-touch sensing touchscreen that uses liquid crystal display (LCD) technology, light emitting diode (LED) technology, or organic light-emitting display (OLED) technology.

The deformable region 206 can include any suitable deformable matter. For example, in one embodiment, the deformable region 206 is filled with air. Other embodiments can include different types of deformable materials in at least one deformable region, such as a gel or a deformable structure (e.g., an elastomeric structure or a foam structure).

Figure 3:
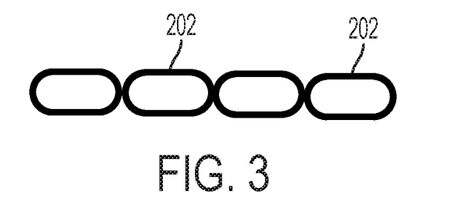
FIG. 3 illustrates one example of multiple heat transfer structures shown in FIG. 2 that can be positioned between two components.

FIG. 3 illustrates one example of multiple heat transfer structures shown in FIG. 2 that can be positioned between two components. The heat transfer structures 202 can be distinct individual structures that are disposed at different locations between the two components in some embodiments. In other embodiments, the heat transfer structures can be connected together in a strip or in a layer that is positioned between the two components.

Figure 4:
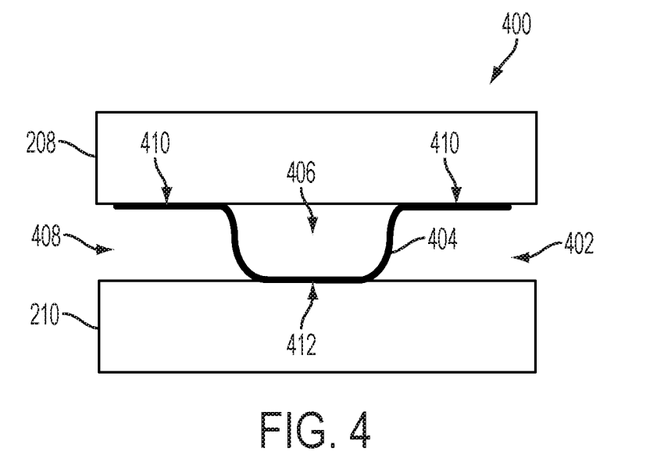
FIG. 4 depicts a simplified side view of an electronic device with a heat transfer structure between two components in another embodiment.

Referring now to FIG. 4, there is shown a simplified electronic device with a heat transfer structure between two components in another embodiment. The heat transfer structure 402 in the electronic device 400 includes a heat transfer member 404 that is shaped to create deformable regions 406, 408 adjacent to or around the heat transfer member 404. The shape of the heat transfer member 404 can form the deformable regions 406, 408. In the illustrated embodiment, the heat transfer member has a wing-like shape or a "U" shaped region with extended horizontal surfaces at the tops of the sides of the U-shaped region. The deformable regions are created by the shape of the heat transfer member 404. The regions within and between the U-shaped region create the deformable regions 406, 408, respectively.

The heat transfer member 404 can be attached to the first component 208 at contact regions 410. Similarly, the heat transfer member 404 can be attached to the second component 210 at contact region 412. The heat transfer member 404 can be attached to the first and second components using any suitable attachment mechanism. For example, an adhesive can be used to affix the heat transfer member to the first and second components.

Like the embodiment shown in FIG. 2, the first component 208 can be an electronic component and the second component a support structure for the electronic component. By way of example only, the electronic component can be a display panel in an electronic device such as a smart telephone, a tablet computing device, a wearable computing device or display, and a digital music player. Additionally, the deformable regions 406, 408 can be filled with air in one embodiment. Other embodiments can include different types of deformable materials, such as a gel packet, a deformable adhesive, or a deformable structure such as an elastomeric structure or a foam structure.

Figure 5:
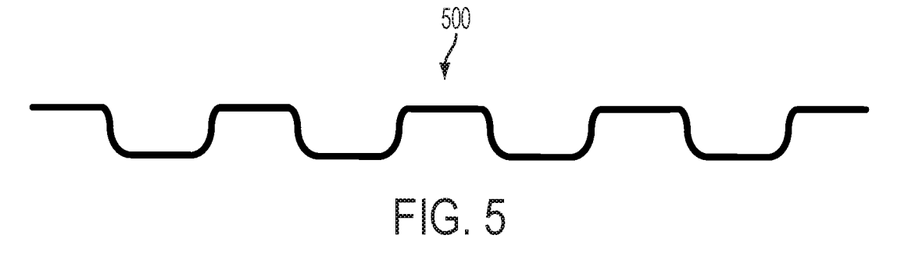
FIG. 5 illustrates one example of multiple heat transfer structures shown in FIG. 4 that can be positioned between two components.

FIG. 5 illustrates one example of multiple heat transfer structures shown in FIG. 4 that can be positioned between two components. The heat transfer structures 402 can be distinct individual structures that are disposed at different locations between the two components, or the heat transfer structures can be connected together in a strip or in a layer that is positioned between the two components.

Other embodiments can arrange the heat transfer member 204, 404 in different configurations or shapes having any given dimensions and size. For example, the heat transfer member 204, 404 can be configured in a hexagon shape, in a shape similar to a square wave, and/or in a rectangle. Additionally or alternatively, some embodiments can include two or more heat transfer structures that have different shapes and/or dimensions.

Figure 6:
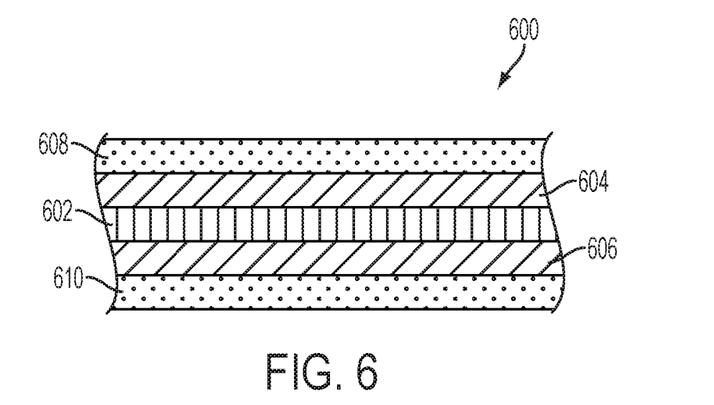
FIG. 6 depicts a cross-sectional view of one example of a heat transfer member.

Referring now to FIG. 6, there is shown a cross-sectional view of one example of a heat transfer member. The heat transfer member 600 includes a flexible thermal conductive layer 602 disposed between a first flexible layer 604 and a second flexible layer 606. The flexible thermal conductive layer 602 can be made of any suitable thermal conductive material, such as graphite, copper, silver, and gold. In embodiments that use a flexible thermal conductive layer made of metal, the thermal conductive layer may also function as an electromagnetic (EMI) or radio frequency (RF) shield for electronic components positioned below the thermal conductive layer.

The first and second flexible layers 604, 606 are attached to the flexible thermal conductive layer 602 and provide mechanical strength to the thermal conductive layer. In one embodiment, the thermal conductive layer 602 is laminated to the first and second flexible layers. The first and second flexible layers 604, 606 can be made of any suitable material, examples of which include polyethylene terephthalate (PET) or another type of polymer.

A first adhesive layer 608 is disposed over the first flexible layer 604 and a second adhesive layer 610 is positioned under the second flexible layer 606. Depending on the configuration of the heat transfer structure, one of the adhesive layers is optional and can be omitted in some embodiments. Alternatively, the first and second adhesive layers 608, 610 can be configured in segments that cover only portions of the first and second flexible layers. For example, in the embodiment shown in FIG. 4 one segment of the second adhesive layer 610 can be located at contact region 412 while other segments of the first adhesive layer 608 can be located at contact regions 410.

Figure 7:
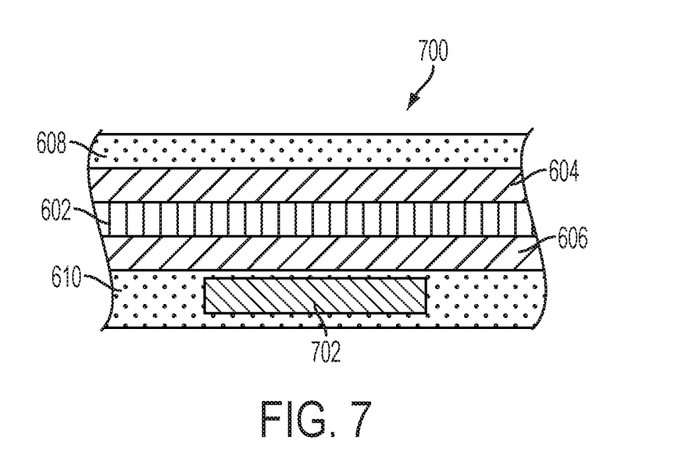
FIG. 7 illustrates a cross-sectional view of another example of a heat transfer member.

Referring now to FIG. 7, there is shown a cross-sectional view of another example of a heat transfer member. The heat transfer member 700 is similar to the embodiment shown in FIG. 6 except for the rigid member 702 affixed to (or within) a portion of the second adhesive layer 610. The rigid member 702 can be a stiffener layer or a shim that provides additional stiffness or rigidity to an area of the heat transfer member 700. The areas that do not include a rigid member are more pliable compared to the area with the rigid member 702. Including one or more rigid members in a heat transfer member can allow the heat transfer member to be folded or shaped into different configurations. For example, rigid members may be included in the heat transfer member 404 shown in FIG. 4 to obtain the wing-like shape of the heat transfer member.

Figure 8:
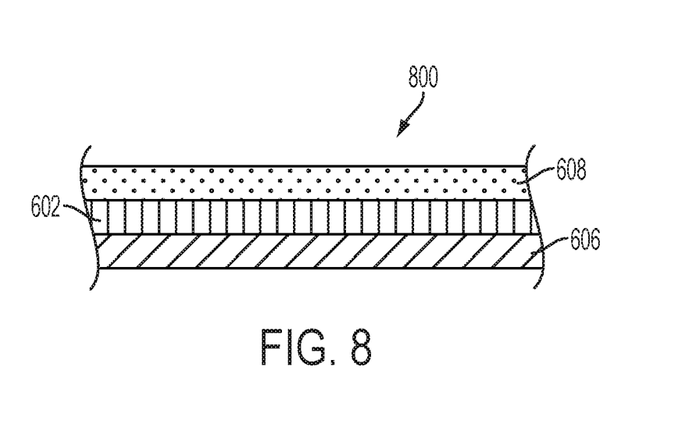
FIG. 8 depicts a cross-sectional view of another example of a heat transfer member.

FIG. 8 depicts a cross-sectional view of another example of a heat transfer member. The heat transfer member 800 omits some of the layers in the embodiment shown in FIG. 6. The first flexible layer 606 is removed and the first adhesive layer 608 is disposed over the thermal conductive layer 602. The second adhesive layer is also omitted. By way of example only, the heat transfer member shown in FIG. 8 can be used to form heat transfer member 204 shown in FIG. 2. The first adhesive layer 608 may be used to attach the heat transfer member to the first and second components 208, 210.

Figure 9:
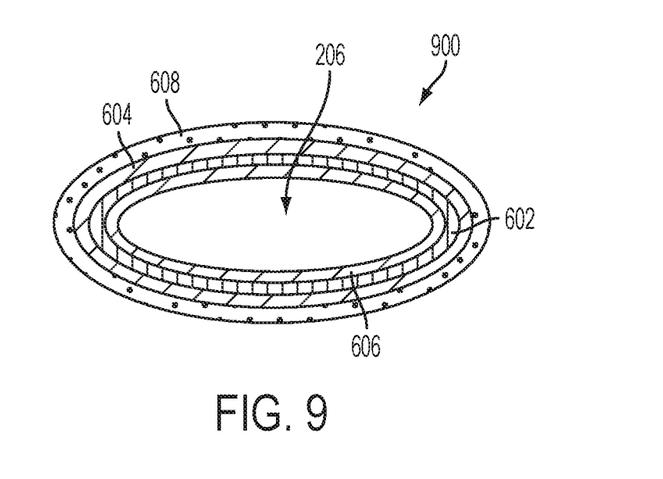
FIG. 9 illustrates one example of a heat transfer member shaped as the heat transfer structure 202 in FIG. 2.

Referring now to FIG. 9, there is shown one example of a heat transfer member shaped as the heat transfer structure 202 in FIG. 2. The heat transfer member 900 includes all of the layers shown in FIG. 6 except for the second adhesive layer 610. The heat transfer member 900 can be wrapped over itself to produce a rounded shape. Although not shown in FIG. 9, the heat transfer member 900 may include a seam where a portion of the heat transfer member is extends or is positioned over itself when wrapped into the rounded shape.

In one embodiment, the heat transfer member 900 is thin and yet flexible. For example, the second flexible layer is a PET layer that is approximately 6 microns thick. The thermal conductive layer can be a graphite layer that has a thickness of approximately 17 microns. And the first flexible layer and the first adhesive layer combined may have a thickness of approximately 10 microns. The layers of a heat transfer member can have different thicknesses in other embodiments.

Figure 10:
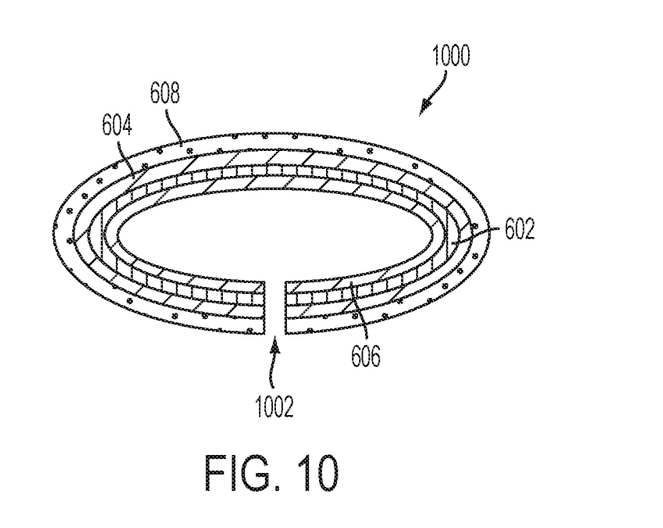
FIG. 10 illustrates another example of a heat transfer member with an opening.

FIG. 10 illustrates another example of a heat transfer member with an opening. The heat transfer member 1000 is similar to the embodiment shown in FIG. 9 except for the opening 1002. The ends of the heat transfer member 1000 may not touch in the illustrated embodiment and form the opening 1002. An opening can have any desired dimensions and a heat transfer member may have any given dimensions and/or shape.

Figure 11:
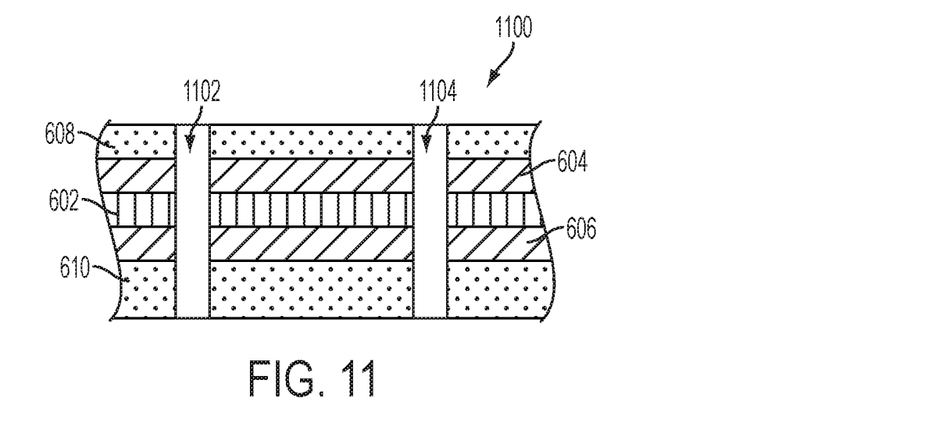
FIG. 11 depicts a cross-sectional view of another example of a heat transfer member having openings.

Referring now to FIG. 11, there is shown a cross-sectional view of another example of a heat transfer member with openings. The heat transfer member 1100 is similar to the embodiment shown in FIG. 6 except for the openings 1102, 1104 formed through the heat transfer member. Like the embodiment of FIG. 10, a heat transfer member can include one or more openings with each opening being positioned at any given location in the heat transfer member and each opening having any given dimensions and/or shape.

The openings can be used to form cutouts in a heat transfer member in some embodiments. The cutouts can prevent heat from spreading to certain areas of a substrate, while the remaining sections of the heat transfer member spread heat to other areas of the substrate. For example, a substrate can have an area that includes electronic components that may not be able to withstand heat or dissipate heat. A cutout in a heat transfer member can be used to prevent heat from transferring to the area with the electronic components.

Figure 12:
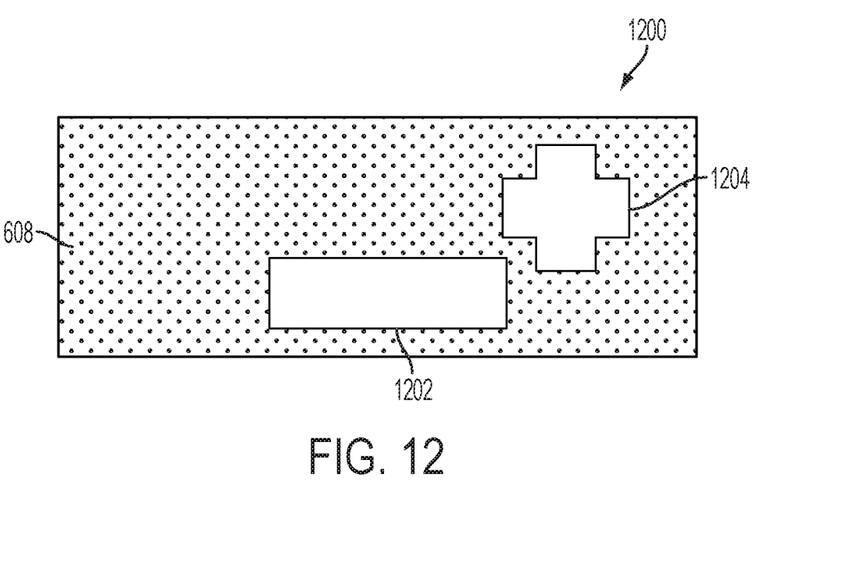
FIG. 12 illustrates a top view of a heat transfer member with cutouts.

FIG. 12 illustrates a top view of a heat transfer member with cutouts. The heat transfer member 1200 includes the first adhesive layer 608 in the illustrated embodiment. One cutout 1202 is in a rectangular shape while another cutout 1204 is in the shape of a cross. A heat transfer member can include one or more cutouts with each cutout having any desired dimensions and positioned at any given location in the heat transfer member.

Figure 13:
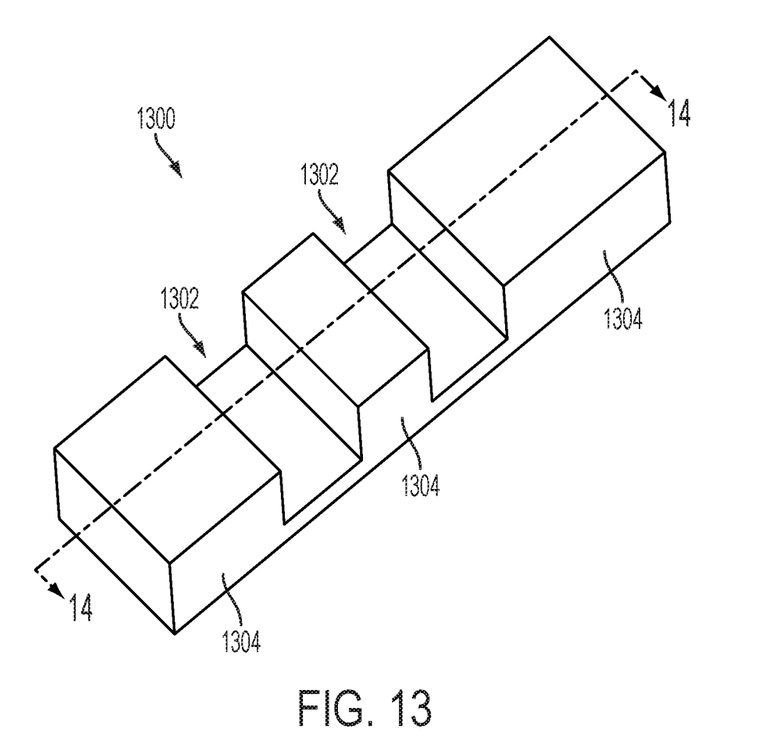
FIG. 13 depicts a perspective view of an example of a heat transfer member with incomplete cutouts.
Figure 14:
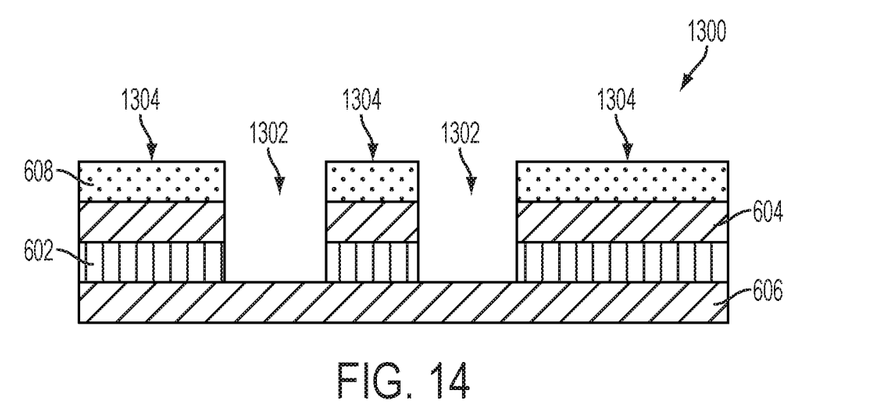
FIG. 14 is a cross-sectional view of the heat transfer member 1300 taken along line 14-14 in FIG. 13.

Referring now to FIG. 13, there is shown a perspective view of an example of a heat transfer member with incomplete cutouts. FIG. 14 is a cross-sectional view of the heat transfer member 1300 taken along line 14-14 in FIG. 13. With reference to FIGS. 13 and 14, the heat transfer member 1300 includes the thermal conductive layer 602 attached to the first and second flexible layers 604, 606. The first adhesive layer 608 is disposed over the first flexible layer 604. The second adhesive layer 610 is now shown in FIG. 14, but embodiments can position the second adhesive layer under the second flexible layer 606.

The incomplete cutouts 1302 are formed through the first adhesive layer 608, the first flexible layer 604, and the thermal conductive layer 602, but not through the second flexible layer 606 in the illustrated embodiment. The incomplete cutouts produce heat transfer regions 1304 in the heat transfer member 1300. The heat transfer member 1300 can introduce a reduced amount of contact force on an electronic component (e.g., first component 208) as a result of the incomplete cutouts 1302. For example, the heat transfer regions 1304 combined can have a smaller contact area on the electronic component than the heat transfer region shown in FIG. 6.

Figure 15:
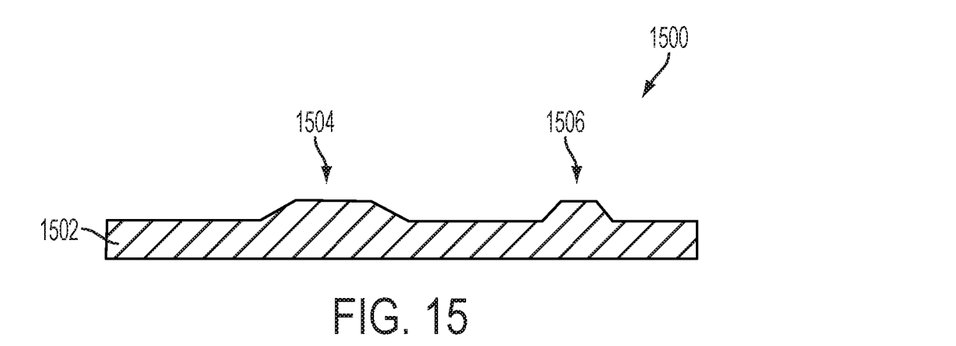
FIGS. 15-16 illustrate other examples of a thermal conductive layer that can be included in a heat transfer member.
Figure 16:
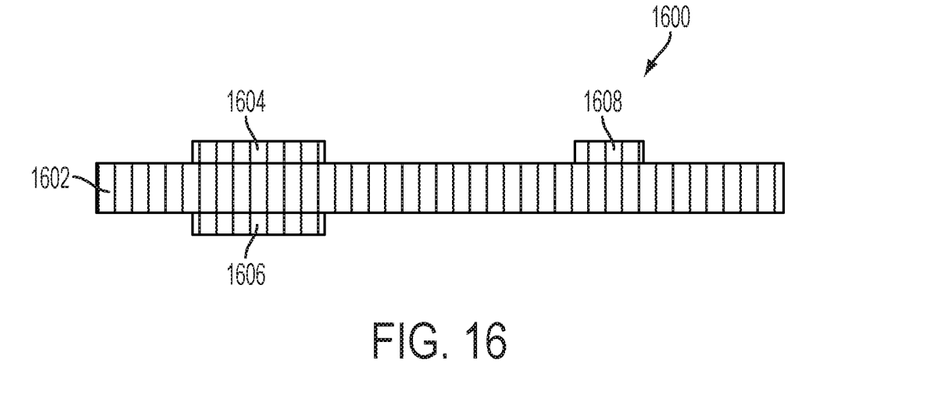

FIGS. 15-16 illustrate other examples of a thermal conductive layer that can be included in a heat transfer member. Each thermal conductive layer 1500, 1600 can have one or more varied surfaces across the thermal conductive layer. In FIG. 15, the thermal conductive layer 1500 is a single layer 1502 that includes two regions of increased thickness 1502, 1504. Each region of increased thickness can have a higher thermal density than the areas of lesser thickness and may dissipate more heat to corresponding sections of a substrate. The thermal conductive layer 1500 can be made of any suitable thermal conductive material, such as copper, silver, and gold. The regions of increased thickness can be located on only one surface of a thermal conductive layer, or one or more regions of increased thickness can be positioned on two or more surfaces of a thermal conductive layer.

In FIG. 16, the thermal conductive layer 1600 is formed with a base thermal conductive layer 1602 that includes three additional layers of thermal conductive material 1604, 1606, 1608 attached to the base thermal conductive layer 1602. The additional layers of thermal conductive material may increase the thermal density of the thermal conductive layer 1600 in the areas where the additional layers are located. The locations of the increased thermal density can dissipate differing amounts of heat to corresponding sections of a substrate compared to the base thermal conductive layer 1602.

The thermal conductive layer 1600 can be made of any suitable thermal conductive material that has a more planar structure, such as graphite. Additionally, the additional layers of thermal conductive material can be located on only one surface of a thermal conductive layer, or one or more regions of increased thickness can be positioned on two or more surfaces of a thermal conductive layer. Additionally or alternatively, an additional layer of thermal conductive material can be disposed over another additional layer of thermal conductive material.

Figure 17:
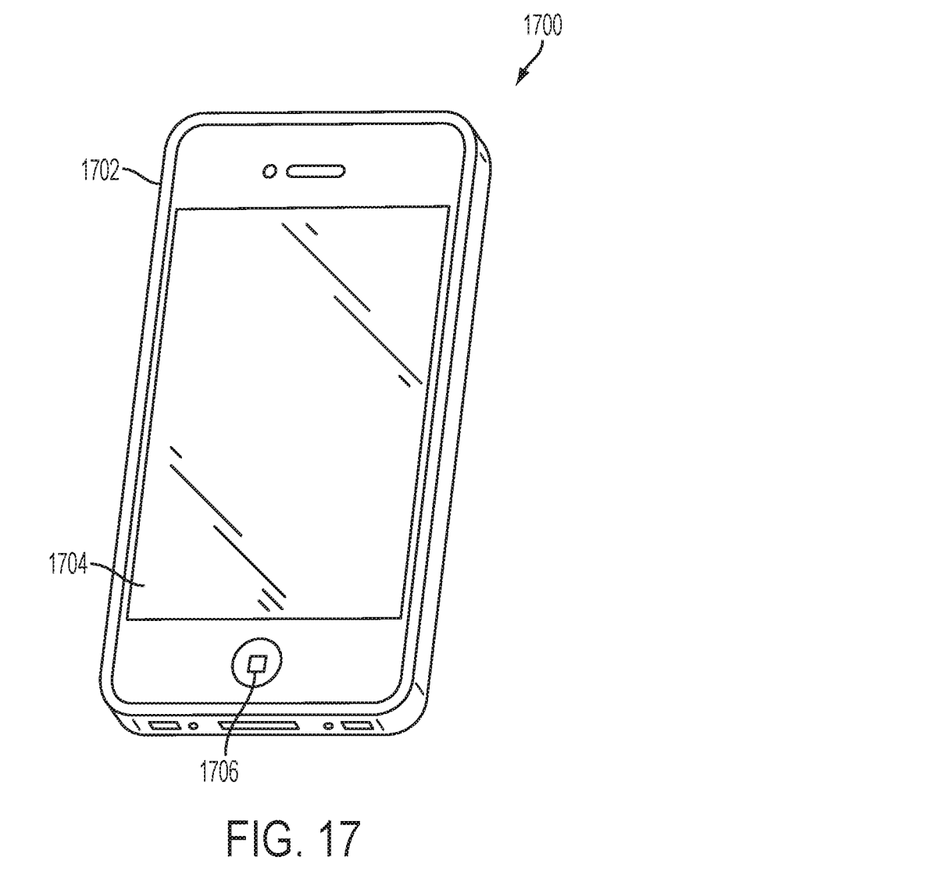
FIG. 17 depicts a perspective view of one example of an electronic device that can include one or more heat transfer structures.

Referring now to FIG. 17, there is shown a perspective view of one example of an electronic device that can include a heat dissipation structure. In the illustrated embodiment, the electronic device 1700 is implemented as a smart telephone. Other embodiments can implement the electronic device differently, such as, for example, as a laptop or desktop computer, a tablet computing device, a gaming device, a wearable computing device or display, a display, a digital music player, and other types of electronic devices that can include a heat transfer structure to transfer heat from an electronic component to a second component in the electronic device.

The electronic device 1700 includes an enclosure 1702 at least partially surrounding a display 1704 and one or more buttons 1706 or input devices. The enclosure 1702 can form an outer surface or partial outer surface and protective case for the internal components of the electronic device 1700, and may at least partially surround the display 1704. The enclosure 1702 can be formed of one or more components operably connected together, such as a front piece and a back piece. Alternatively, the enclosure 1702 can be formed of a single piece operably connected to the display 1704.

The display 1704 can be implemented with any suitable technology, including, but not limited to, a multi-touch sensing touchscreen that uses liquid crystal display (LCD) technology, light emitting diode (LED) technology, organic light-emitting display (OLED) technology, organic electroluminescence (OEL) technology, or another type of display technology. The button 1706 can take the form of a home button, which may be a mechanical button, a soft button (e.g., a button that does not physically move but still accepts inputs), an icon or image on a display or on an input region, and so on. Further, in some embodiments, the button 1706 can be integrated as part of a cover glass of the electronic device.

One or more heat transfer structures described herein can be used to transfer heat from a bottom surface of the display 1704 to a support structure or heat sink in the electronic device 1700. The heat transfer structures introduce a reduced physical pressure compared to prior art thermal contacts or heat transfer structures. In some embodiments, the heat transfer structure(s) may produce substantially no physical pressure on the bottom surface of the display 1704.

Figure 18:
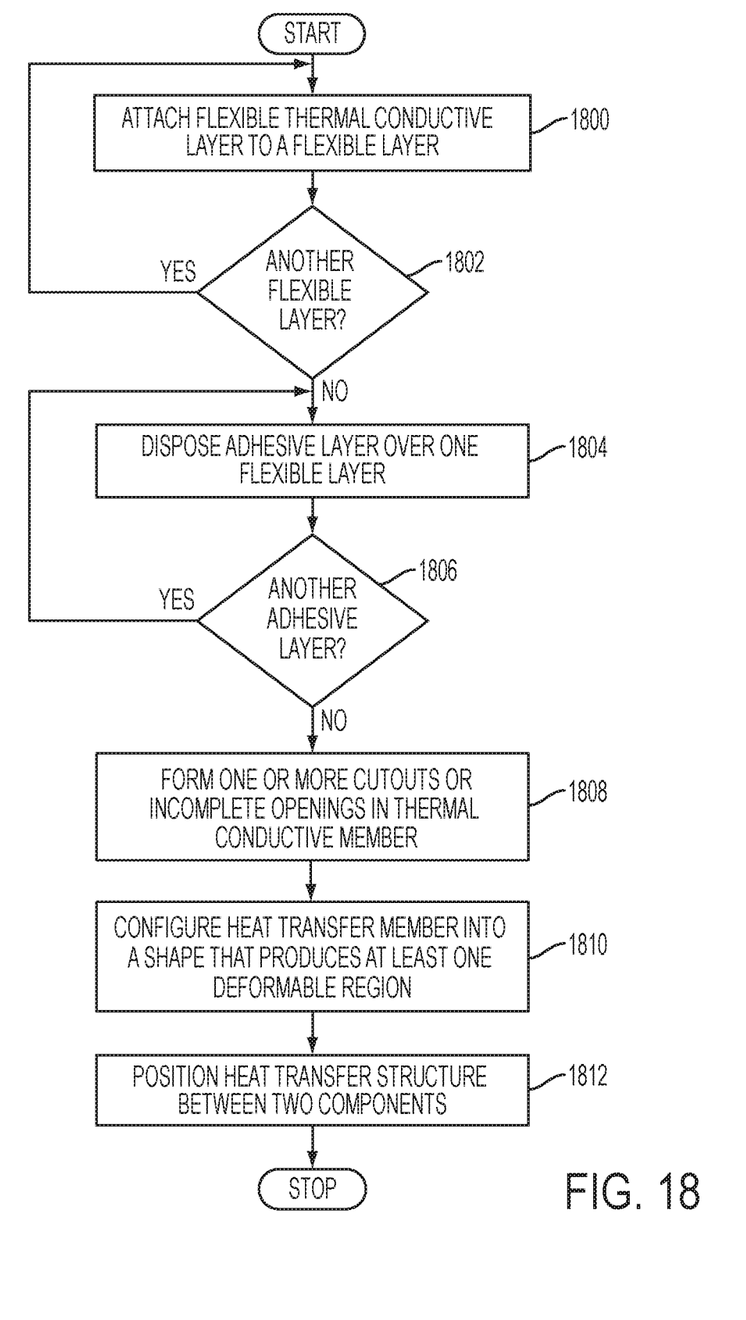
FIG. 18 is a flowchart of a method for providing a heat transfer structure.

FIG. 18 is a flowchart of a method for providing a heat transfer structure. Initially, as show in block 1800, a flexible thermal conductive layer is attached to a flexible layer. As one example, the flexible thermal conductive layer can be laminated to the first flexible layer. A determination is then made at block 1802 as to whether another flexible layer is to be attached to the thermal conductive layer. If so, the process returns to block 1800. When another flexible layer will not be attached to the thermal conductive layer, the method continues at block 1804 where an adhesive layer is disposed over a flexible layer. For example, the first adhesive layer can be disposed over the first flexible layer, as shown in FIG. 6. Alternatively, in some embodiments the adhesive layer may be disposed over a layer other than a flexible layer. For example, the adhesive layer can be positioned over a thermal conductive layer.

A determination is then made at block 1806 as to whether another adhesive layer is to be included in the heat transfer member. If so, the process returns to block 1804 and another adhesive layer is disposed over a flexible layer. For example, the second adhesive layer can be disposed under the second flexible layer, as shown in FIG. 6. Alternatively, in some embodiments the other adhesive layer may be disposed over a layer other than a flexible layer.

When another adhesive layer will not be disposed over a flexible layer, the method passes to block 1808 where one or more cutouts and/or incomplete openings may be formed in the thermal conductive member. Any suitable method can be used to produce the one or more cutouts and/or incomplete openings in the thermal conductive layer.

Next, as shown in block 1810, the heat transfer member can be configured into a shape that provides one or more deformable structures. As one example, the heat transfer member can be wrapped onto itself to form a rounded shape, and the interior region of the rounded shape forms a deformable region. As another example, the heat transfer member can be configured into a wing-like shape or a U-shaped region having extended horizontal surfaces at the top of the sides. The regions within and between the U shaped region can form the deformable regions.

Next, as shown in block 1812, the heat transfer member is positioned between a heat generating component and a heat dissipating component. The one or more adhesive layers can be used to attach the heat transfer structure to the heat generating component and the heat dissipating component. For example, the first adhesive layer shown in FIG. 9 can be used to attach the heat transfer member to the two components. Alternatively, in the embodiment shown in FIG. 4, the first adhesive layer can be disposed only over the horizontal surfaces extending out from the tops of the sides, and this first adhesive layer can be used to attach the heat transfer member to one component. The second adhesive layer may only be disposed between the substantially flat bottom of the U-shaped region and the other component, and the second adhesive layer can attach the heat transfer member to the other component.

Other embodiments can perform the method shown in FIG. 18 differently. Blocks can be added and some blocks can be omitted. As one example, block 1802 and/or block 1806 can be omitted in embodiments that include only one flexible layer (e.g., see FIG. 8) and/or only one adhesive layer (e.g., see FIG. 8), respectively. As another example, block 1808 can be omitted in embodiments where one or more cutouts, openings, and/or incomplete openings are not formed in the heat transfer member.

Various embodiments have been described in detail with particular reference to certain features thereof, but it will be understood that variations and modifications can be effected within the spirit and scope of the disclosure. And even though specific embodiments have been described herein, it should be noted that the application is not limited to these embodiments. In particular, any features described with respect to one embodiment may also be used in other embodiments, where compatible. Likewise, the features of the different embodiments may be exchanged, where compatible. For example, some embodiments can include two or more heat transfer structures, and a thermal conductive layer in one structure can be made of material that is different from a thermal conductive material in another thermal transfer structure. The two or more heat transfer structures can be used with a single electronic component that generates heat or with multiple electronic components.

We claim:

1. A heat transfer member, comprising:
   a flexible layer; and
   a thermal conductive layer attached to the flexible layer; wherein
   a first end of the heat transfer member is coupled to a second end of the heat transfer member, thereby forming an enclosed loop; and
   the loop is deformable to conform to a size of a gap between a heat generating component and a heat dissipating component.

2. The heat transfer member as in claim 1, wherein the loop is filled with air.

3. The heat transfer member as in claim 1, wherein the thermal conductive layer comprises a graphite layer.

4. The heat transfer member as in claim 1, wherein the flexible layer comprises a polymer layer.

5. The heat transfer member as in claim 1, wherein the heat transfer member further comprises an adhesive layer disposed over a surface of the thermal conductive layer that is not attached to the flexible layer.

6. The heat transfer member as in claim 1, wherein:
   the flexible layer comprises a first flexible sub-layer and a second flexible sub-layer;
   the thermal conductive layer is positioned between the first and second flexible sub-layers; and
   the heat transfer member further comprises a first adhesive layer disposed over the first flexible sub-layer.

7. The heat transfer member as in claim 1, further comprising an opening extending through the heat transfer member.

8. The heat transfer member as in claim 1, further comprising a cutout extending only partially through the heat transfer member.

9. The heat transfer member as in claim 1, wherein the thermal conductive layer comprises a region having a higher thermal density than another region of the thermal conductive layer.

10. An electronic device, comprising:
    a first component;
    a second component; and
    a heat transfer member disposed between the first and second components to transfer heat from one of the first or second components to the other of the first and second components, comprising:
      first and second ends coupled to the first component; and
      an intermediate portion between the first and second ends coupled to the second component and defining a space between the heat transfer member and the first component;
    wherein
    the heat transfer member comprises a thermal conductive layer and a flexible layer attached to the thermal conductive layer; and
    the intermediate portion is deformable to adjust to a size of a gap between the first and second components.

11. The electronic device as in claim 10, wherein:
    the space is filled with air; and
    the thermal conductive layer comprises a graphite layer.

12. The electronic device as in claim 10, wherein:
    one of the first or the second component comprises a display; and
    the heat transfer member is attached to a bottom surface of the display.

13. The electronic device as in claim 10, wherein the flexible layer comprises a polymer layer.

14. The electronic device as in claim 10, wherein the heat transfer member further comprises an adhesive layer disposed over a surface of the thermal conductive layer that is not attached to the flexible layer.

15. The electronic device as in claim 10, wherein:
    the flexible layer comprises a first flexible sub-layer and a second flexible sub-layer;
    the thermal conductive layer is positioned between the first and second flexible sub-layers; and
    the heat transfer member further comprises a first adhesive layer disposed over the first flexible sub-layer.

16. The electronic device as in claim 10, further comprising an opening extending through the heat transfer member.

17. The electronic device as in claim 10, further comprising a cutout extending only partially through the heat transfer member.

18. The electronic device as in claim 10, wherein the thermal conductive layer comprises a region having a higher thermal density than another region of the thermal conductive layer.

19. The electronic device as in claim 10, wherein the thermal conductive layer comprises a metal layer that is an EMI shield for one or more electronic components positioned below the thermal conductive layer.

20. The electronic device as in claim 10, wherein the heat transfer member further comprises stiffening layers at the first and second ends that increase the rigidity of the first and second ends relative to the intermediate portion.

21. An electronic device, comprising:
a heat generating component;
a heat dissipating component set apart from the heat generating component by a gap; and
a looped heat transfer member disposed in the gap and defining an inner surface and an outer surface, the looped heat transfer member comprising a flexible layer and a thermal conductive layer; wherein
a first portion of the outer surface is coupled to the heat generating component;
a second portion of the outer surface is coupled to the heat generating component;
a third portion of the outer surface between the first and second portions is coupled to the heat dissipating component; and
the looped heat transfer member is deformed by the heat generating component and the heat dissipating component to fit within the gap.

22. The electronic device of claim 21, wherein the plurality of laminations comprises:
a first flexible layer; and
a second flexible layer;
a thermal conductive layer positioned between the first and second flexible layers; and
a first adhesive layer disposed over the first flexible layer.

23. The electronic device of claim 22, wherein:
a surface of the first flexible layer is in substantially complete contact with a first surface of the thermal conductive layer; and
a surface of the second flexible layer is in substantially complete contact with a second surface of the thermal conductive layer.

24. The electronic device of claim 22, wherein:
the electronic device further comprises an electronic component; and
the looped heat transfer member defines an opening positioned relative to the electronic component such that the looped heat transfer member does not contact the electronic component.

25. The electronic device of claim 22, wherein the looped heat transfer member comprises a thermal conductive material covering a portion of the looped heat transfer member to increase a thermal density of the portion relative to another portion of the looped heat transfer member.

* * * * *